(12) United States Patent
Fujise et al.

(10) Patent No.: US 12,402,250 B2
(45) Date of Patent: Aug. 26, 2025

(54) BASE MEMBER

(71) Applicant: CANON KABUSHIKI KAISHA, Tokyo (JP)

(72) Inventors: Yoshihiko Fujise, Kanagawa (JP); Koichi Odagaki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 587 days.

(21) Appl. No.: 17/704,649

(22) Filed: Mar. 25, 2022

(65) Prior Publication Data

US 2022/0322531 A1   Oct. 6, 2022

(30) Foreign Application Priority Data

Mar. 31, 2021   (JP) .................................. 2021-061120

(51) Int. Cl.
| | |
|---|---|
| *H05K 1/11* | (2006.01) |
| *H05K 3/34* | (2006.01) |
| *G01C 19/5783* | (2012.01) |
| *G03B 17/14* | (2021.01) |

(52) U.S. Cl.
CPC ............. *H05K 1/115* (2013.01); *H05K 3/341* (2013.01); *G01C 19/5783* (2013.01); *G03B 17/14* (2013.01); *H05K 2201/09409* (2013.01)

(58) Field of Classification Search
CPC .................. H05K 1/115; H05K 1/116; H05K 2201/09409; H05K 2201/09827; H05K 2201/09854; H05K 2201/0191; G01C 19/5783; G03B 17/14; G03B 2205/0007; G03B 13/36; G03B 30/00
See application file for complete search history.

(56) References Cited

U.S. PATENT DOCUMENTS

| | | | | |
|---|---|---|---|---|
| 2012/0186866 A1* | 7/2012 | Mikado | ................ | H05K 3/4602 |
| | | | | 29/832 |
| 2020/0315009 A1* | 10/2020 | Nakamura | ........... | H05K 1/0271 |

FOREIGN PATENT DOCUMENTS

JP   2013044645 A   3/2013

* cited by examiner

*Primary Examiner* — Roshn K Varghese
(74) *Attorney, Agent, or Firm* — Canon U.S.A., Inc. IP Division

(57) ABSTRACT

A base member includes a via having a first hole and a second hole. When viewed from a direction in which a base surface extends, the first hole and the second hole have shapes becoming wider as getting closer to a first surface and a second surface of the base surface from a portion at which a lower end of the first hole and an upper end of the second hole are in contact with each other. When the first hole and the second hole are viewed from the direction in which the base surface extends, a smaller angle of angles formed by a generatrix of the first hole and a generatrix of the second hole is smaller in a thin region of the base member than in a thick region of the base member.

3 Claims, 14 Drawing Sheets

BASE MEMBER

BACKGROUND

Field

The present disclosure relates to a base member formed using a molded interconnect device (MID) technique.

Description of the Related Art

Recent electronic devices, such as cameras and smartphones, and transport devices, such as automobiles, have incorporated therein sensor modules that are modularized and equipped with various sensors.

As such sensor modules, sensor modules formed using the MID technique have been known.

The MID technique is a technique of irradiating a predetermined portion of a base member with laser and coating the irradiated portion with metal plating. The portion coated with metal plating functions as a conductive pattern.

For example, Japanese Patent Application Laid-Open No. 2013-44645 discusses an MID package including three gyroscopic elements provided on the respective three slopes of a main body having a substantially three-sided pyramid shape in which a first pyramidal surface, a second pyramidal surface, and a third pyramidal surface are orthogonal to each other.

In recent years, there has been an increasing demand for the downsizing of electronic devices. Accordingly, the realization of a base member like a compact sensor module that can be easily accommodated into a downsized electronic device has been desired.

With the conventional technique discussed in Japanese Patent Application Laid-Open No. 2013-44645, large dimensions of the MID package in longitudinal, transverse, and thickness directions have hindered the downsizing of electronic devices.

In addition, the three-sided pyramid shape has been undesirable from the aspect of accommodating the MID package into an electronic device because a dead space is easily generated inside the electronic device.

SUMMARY

The present disclosure is directed to providing a compact base member having a shape suitable for being accommodated in an electronic device.

According to an aspect of the present disclosure, a base member is a molded component in which pattern wiring is directly formed. The base member includes a base surface including a first surface and a second surface on an opposite side of the first surface, and a via for electrically connecting the first surface and the second surface. In the via, a shape at a lower end of a first hole having a circular frustum shape and a shape at an upper end of a second hole having a circular frustum shape are same as each other. When viewed from a direction in which the base surface extends, the via has a structure in which a pattern is formed from the first surface to the second surface of the base surface on an internal wall of a hole having a shape in which the first hole and the second hole are stacked in such a manner that the lower end of the first hole and the upper end of the second hole are in contact with each other. When viewed from the direction in which the base surface extends, the first hole and the second hole have the circular frustum shapes becoming wider as getting closer to the first surface and the second surface of the base surface from a portion at which the lower end of the first hole and the upper end of the second hole are in contact with each other. When the first hole and the second hole are viewed from the direction in which the base surface extends, a smaller angle of angles formed by a generatrix of the first hole and a generatrix of the second hole is smaller in a thin region of the base member than in a thick region of the base member.

Further features of the present disclosure will become apparent from the following description of exemplary embodiments with reference to the attached drawings.

DESCRIPTION OF THE EMBODIMENTS

Hereinafter, exemplary embodiments of the present disclosure will be described in detail with reference to the attached drawings.

A molded interconnect device (MID) refers to an injection molded component where wiring and electrodes are formed.

A first exemplary embodiment of the present disclosure will be described with reference to FIGS. 1 to 7B.

<Block Diagram Illustrating Configuration Example of Digital Camera>

Figure 1:
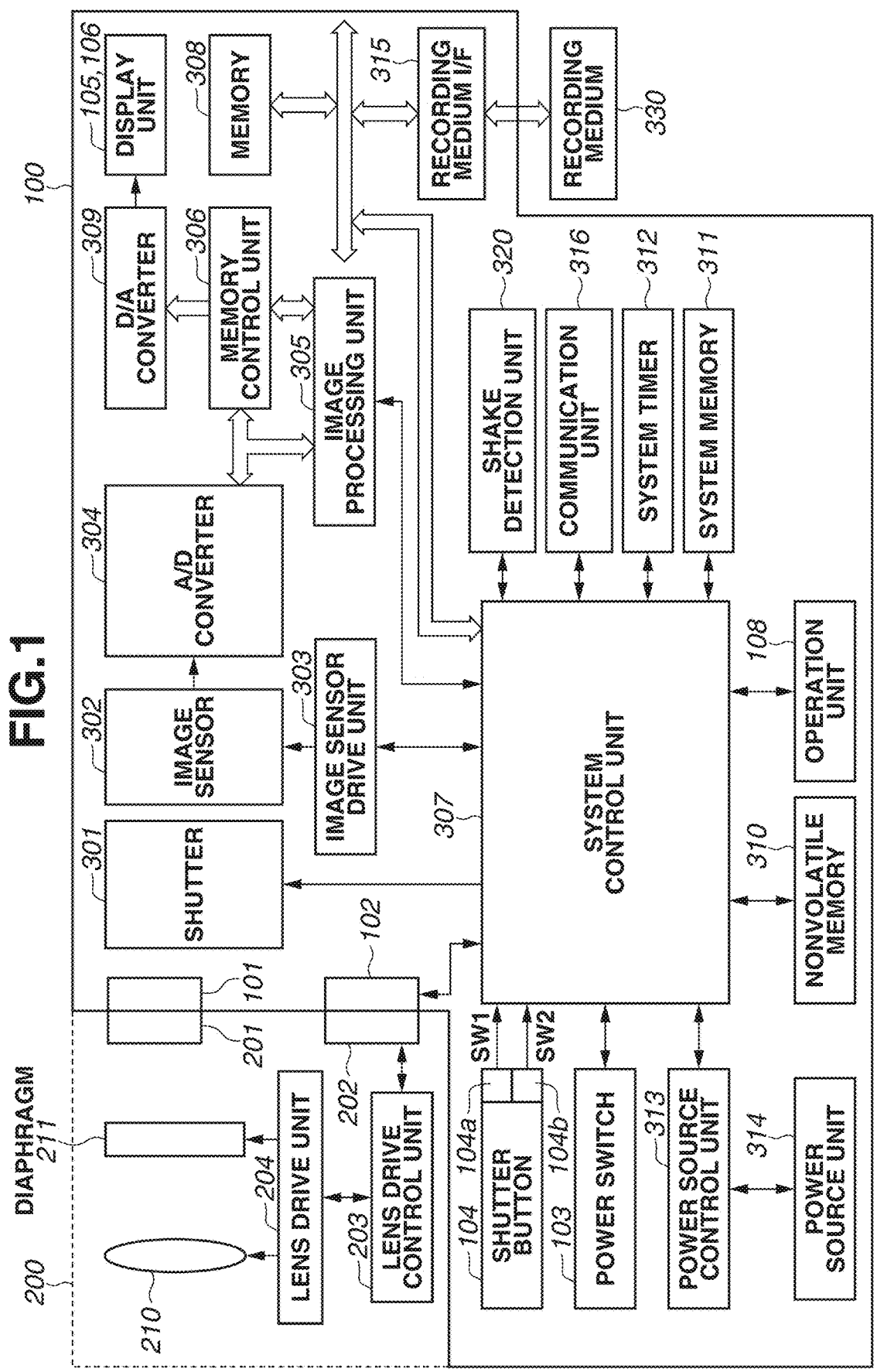
FIG. 1 is a block diagram illustrating a configuration of a camera according to a first exemplary embodiment of the present disclosure.

FIG. 1 is a block diagram illustrating a configuration example of a digital camera (hereinafter referred to as a camera) 100 according to the present exemplary embodiment. The camera 100 is an interchangeable lens camera to which a lens unit 200 is detachably attached.

Figure 2A:
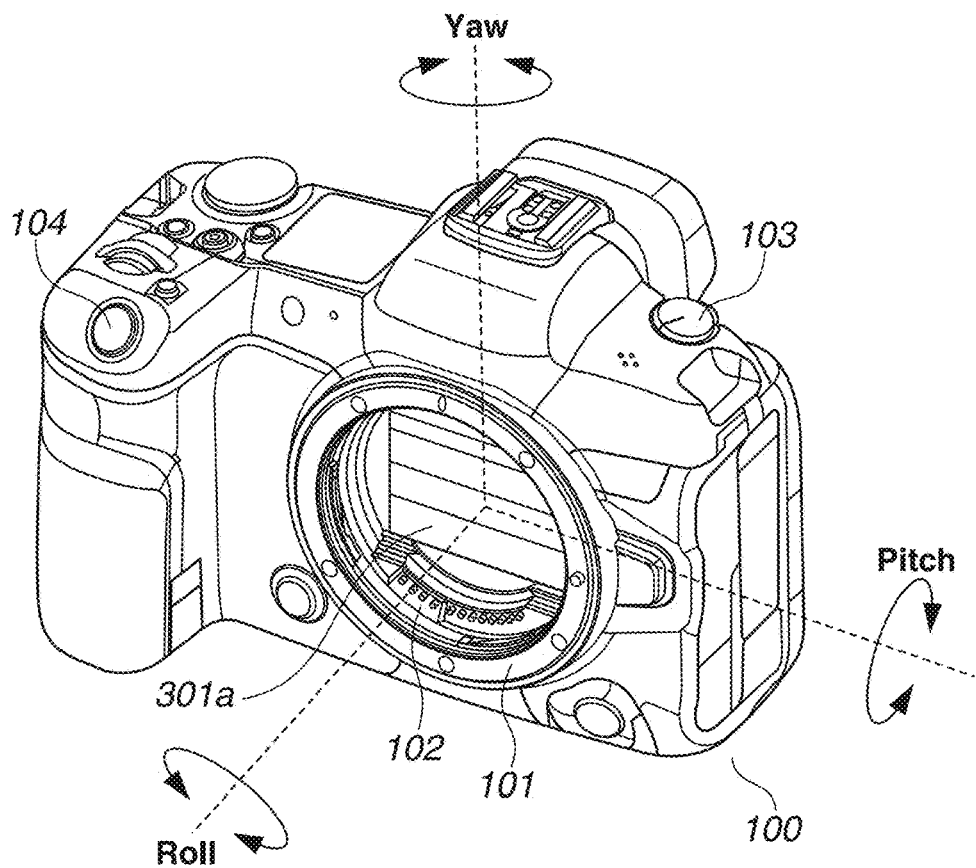
FIGS. 2A and 2B are external perspective views of the camera according to the first exemplary embodiment.
Figure 2B:
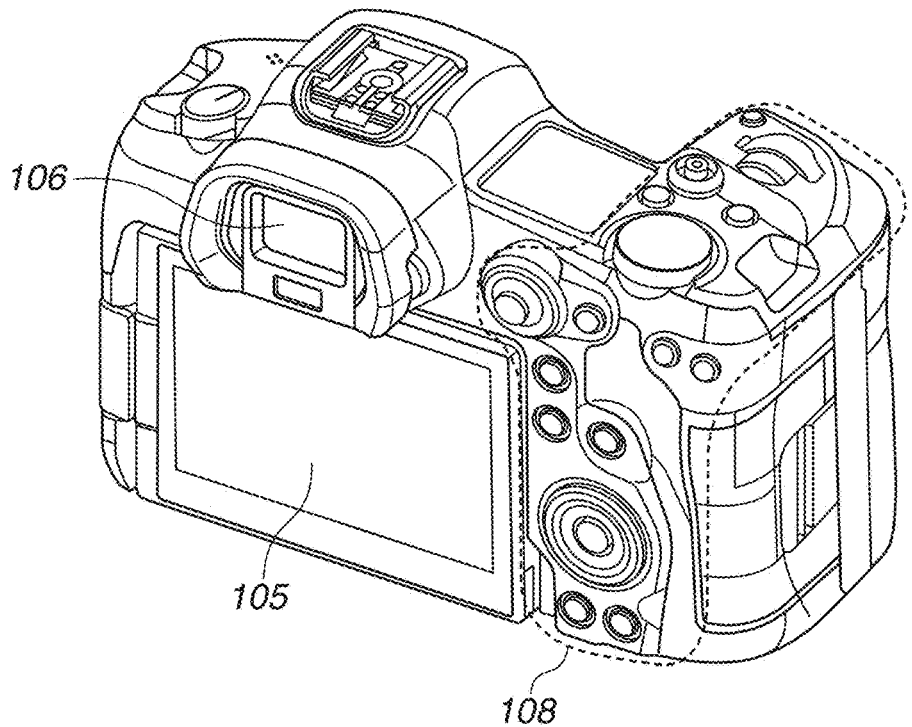

FIGS. 2A and 2B are external perspective views of the camera 100.

The lens unit 200 illustrated in FIG. 1 is fixed to the camera 100 by a lens mount 201 included in the lens unit 200 and a lens mount 101 included in the camera 100.

The lens unit 200 and the camera 100 are configured to communicate with each other via a connector 202 included in the lens unit 200 and a connector 102 included in the camera 100.

More specifically, a system control unit 307 and a lens drive control unit 203 communicate with each other.

Based on a signal from the system control unit 307, the lens drive control unit 203 controls a lens drive unit 204 to drive a diaphragm 211 and a lens 210.

The lens 210 is configured to form an optical image of a subject onto an image sensor 302.

A shutter 301 is arranged between the image sensor 302 and the lens 210, and blocks light from the lens 210 to the image sensor 302 in a non-image-capturing state.

At the time of image capturing, the shutter 301 is opened under control of the system control unit 307, so that the lens 210 can form the optical image onto the image sensor 302.

The image sensor 302 is for example a charge-coupled device (CCD) image sensor or a complementary metal-oxide semiconductor (CMOS) image sensor that converts the optical image into an electrical signal.

An analog-to-digital (A/D) converter 304 converts an analog signal into a digital signal. The A/D converter 304 is used to convert the analog signal output from the image sensor 302, into a digital signal.

An image processing unit 305 performs resizing processing, such as predetermined pixel interpolation or reduction, and color conversion processing on data from the A/D converter 304 or data from a memory control unit 306.

The image processing unit 305 also performs predetermined calculation processing using data of a captured image. The system control unit 307 performs exposure control and ranging control based on a calculation result obtained by the calculation processing.

Through-the-lens (TTL) system autofocus (AF) processing, autoexposure (AE) processing, and electronic flash pre-emission (EF) processing are thereby performed.

Furthermore, the image processing unit 305 performs predetermined calculation processing using data of a captured image and performs TTL system automatic white balance (AWB) processing based on a calculation result obtained by the calculation processing.

Output data from the A/D converter 304 is directly written into a memory 308 via the image processing unit 305 and the memory control unit 306, or via the memory control unit 306.

The memory 308 stores image data for displaying image data subjected to the A/D conversion by the A/D converter 304, on a display unit 105 or 106.

The memory 308 also serves as a memory (a video memory) for image display.

A digital-to-analog (D/A) converter 309 converts the data for image display that is stored in the memory 308, into an analog signal, and supplies the analog signal to the display unit 105 or 106.

In this manner, the image data to be displayed, which has been written into the memory 308, is displayed by the display unit 105 or 106 via the D/A converter 309.

The display units 105 and 106 perform display based on the analog signal from the D/A converter 309, on a display device such as a liquid crystal display (LCD).

The digital signals subjected to the A/D conversion once by the A/D converter 304 and stored in the memory 308 are subjected to the D/A conversion by the D/A converter 309.

The resulting analog signals are then sequentially transferred to the display unit 105 or 106 and displayed thereon, so that through-the-lens image display (live view display) can be performed.

A nonvolatile memory 310 serves as an electrically erasable and recordable recording medium. For example, an electrically erasable programmable read-only memory (EEPROM) is used as the nonvolatile memory 310.

The nonvolatile memory 310 stores constants for operating the system control unit 307, programs, and the like.

The system control unit 307 includes at least one processor, and controls the entire camera 100 and the lens unit 200.

A random access memory (RAM) is used as a system memory 311. Constants and variables for operating the system control unit 307, and the programs read out from the nonvolatile memory 310 are loaded into the system memory 311.

The system control unit 307 also performs display control by controlling the memory 308, the D/A converter 309, and the display unit 105 or 106.

A system timer 312 measures times used in various types of control or a time of a built-in clock.

A first shutter switch 104a is turned on in the middle of an operation of a shutter button 104 provided on the camera 100, i.e., when the shutter button 104 is pressed halfway (to issue an image capturing preparation instruction), and generates a first shutter switch signal SW1.

Based on the first shutter switch signal SW1, operations such as AF processing, AE processing, AWB processing, and EF processing are started.

A second shutter switch 104b is turned on upon completion of the operation of the shutter button 104, i.e., when the shutter button 104 is pressed completely (to issue an image capturing instruction), and generates a second shutter switch signal SW2.

Based on the second shutter switch signal SW2, the system control unit 307 controls the shutter 301 to drive a shutter blade 301a.

The system control unit 307 then starts operations of a series of image capturing processes from the readout of a signal from the image sensor 302 to the writing of image data onto a recording medium 330.

The shutter blade 301a operates at a high speed inside the shutter 301 in a direction vertical to an optical axis of the lens 210, and instantaneously stops the operation by hitting a stopper member (not illustrated) provided inside the shutter 301.

When various function icons displayed on the display unit 105 or 106 are selectively operated, functions are appropriately allocated to operation members of an operation unit 108 depending on the scene, so that the operation members serve as various function buttons.

Examples of the function buttons include an end button, a return button, an image feed button, a jump button, a narrowing down button, and an attribute change button.

For example, if a menu button is pressed, a menu screen for enabling a user to make various settings is displayed on the display unit 105 or 106.

A power switch 103 is used to power on or off the camera 100.

A power source control unit 313 includes a battery detection circuit, a direct current (DC)-DC converter, and a switch circuit for switching a block to be supplied with power. The power source control unit 313 detects whether a battery is attached, a type of the battery, and a remaining capacity of the battery.

In addition, the power source control unit 313 controls the DC-DC converter based on a result of the detection and an instruction from the system control unit 307, and supplies an appropriate voltage for an appropriate time period to the components including the recording medium 330.

A power source unit 314 includes a primary battery such as an alkaline battery or a lithium battery, a secondary battery such as a nickel-cadmium (NiCd) battery, a nickel-metal hydride (NiMH) battery, or a lithium (Li) battery, and an alternating current (AC) adapter.

A recording medium interface (I/F) 315 is an interface with the recording medium 330 such as a memory card or a hard disc.

The recording medium 330 is for example a memory card for recording a captured image, and includes a semiconductor memory, an optical disc, or a magnetic disc.

A communication unit 316 is connected wirelessly or via a wired cable, and transmits or receives a video signal, an audio signal, and the like.

The communication unit 316 is also connectable with a wireless local area network (LAN) and the Internet.

The communication unit 316 is capable of transmitting an image (including a through-the-lens image) captured by the image sensor 302 and an image recorded on the recording medium 330. The communication unit 316 is also capable of receiving image data and other various types of information from an external device.

<Shake Detection Unit/Gyro Sensor>

A shake detection unit 320 is for example a gyro sensor, and detects a shake amount of the camera 100.

The shake detection unit 320 detects the shake and the shake amount of the camera 100 in three axis directions, i.e., a pitch direction, a yaw direction, and a roll direction.

In the camera 100 illustrated in FIG. 1, an image sensor drive unit 303 performs optical shake correction by controlling a movement of the image sensor 302 based on the shake amount detected by the shake detection unit 320.

Under control of the system control unit 307, the image processing unit 305 electronically performs shake correction of an image based on the shake amount detected by the shake detection unit 320.

<Exploded Perspective View of Camera>

Figure 3:
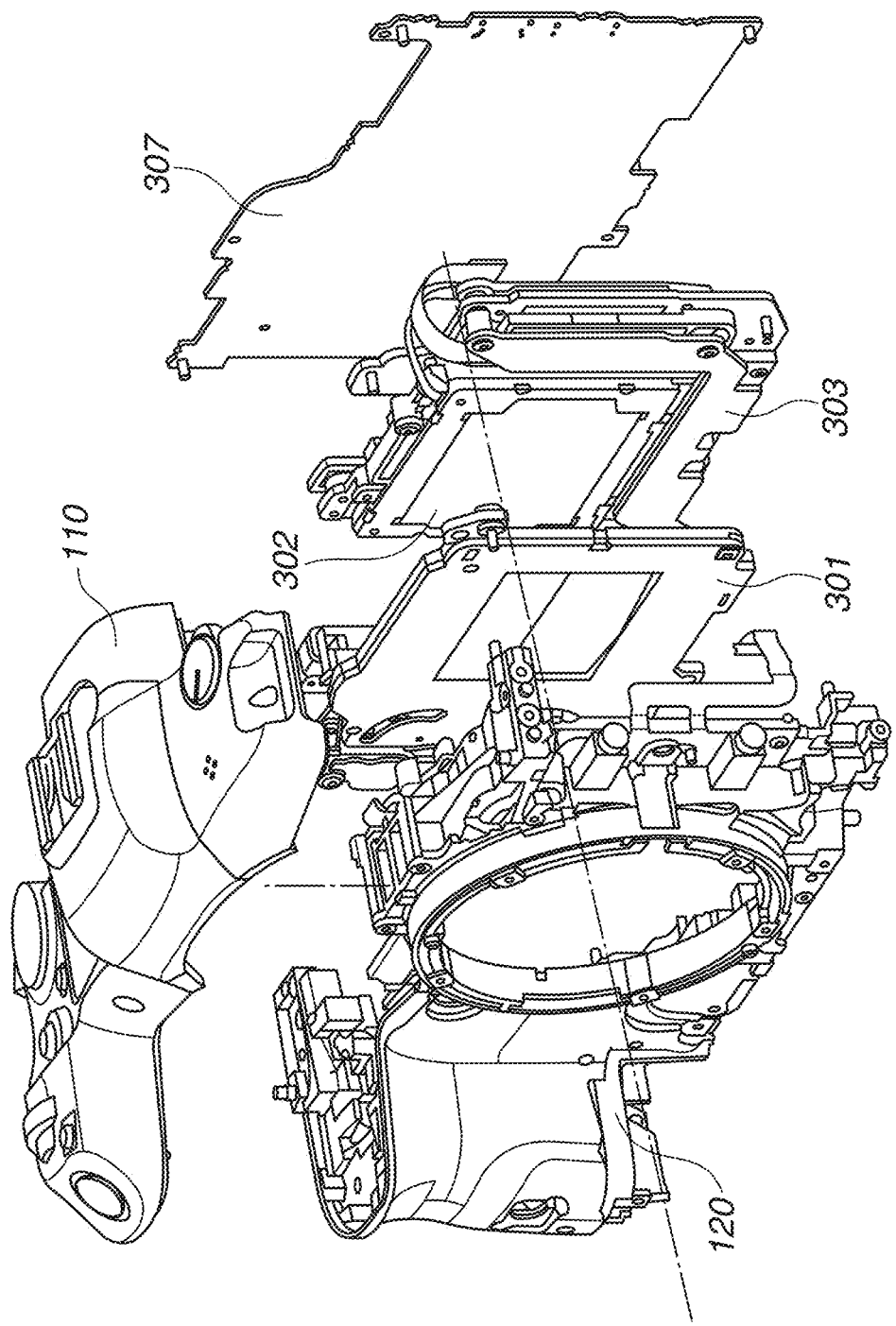
FIG. 3 is an exploded perspective view of the camera according to the first exemplary embodiment.

FIG. 3 is an exploded perspective view of the camera 100 excluding front, rear, and lower cover members.

A ground plate 120 is a structure that provides strength of the camera 100. The shutter 301, the image sensor 302, the image sensor drive unit 303, and the system control unit 307 are fastened to the ground plate 120 with screws (not illustrated).

A top cover unit 110 is fastened to the ground plate 120 with screws (not illustrated).

<External Perspective View of Top Cover Unit>

Figure 4A:
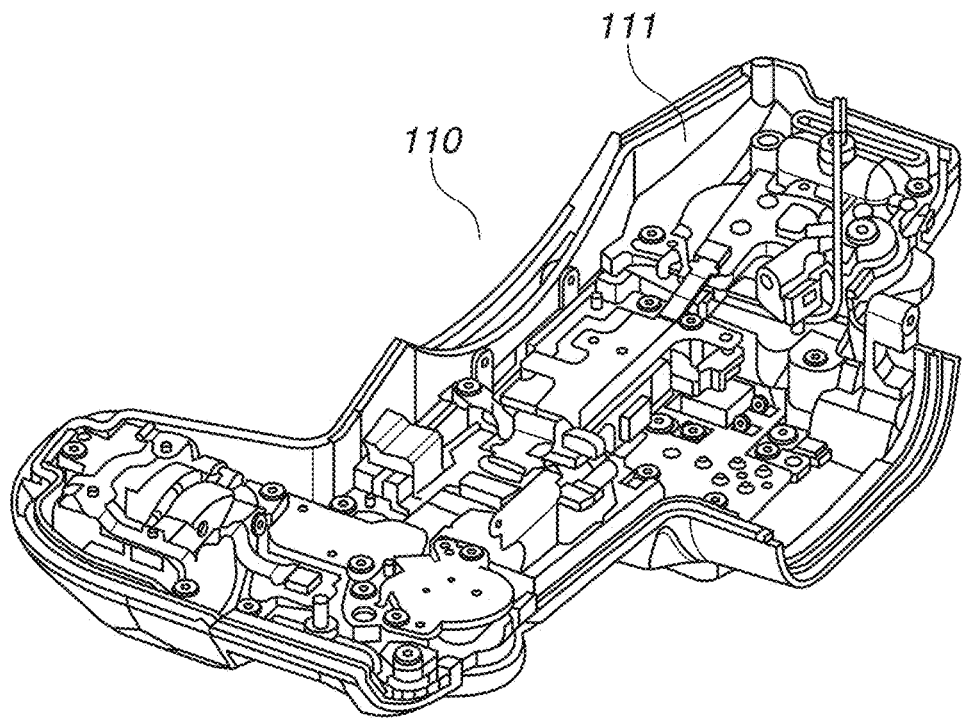
FIGS. 4A and 4B are perspective views illustrating an internal configuration of a top cover unit according to the first exemplary embodiment.
Figure 4B:
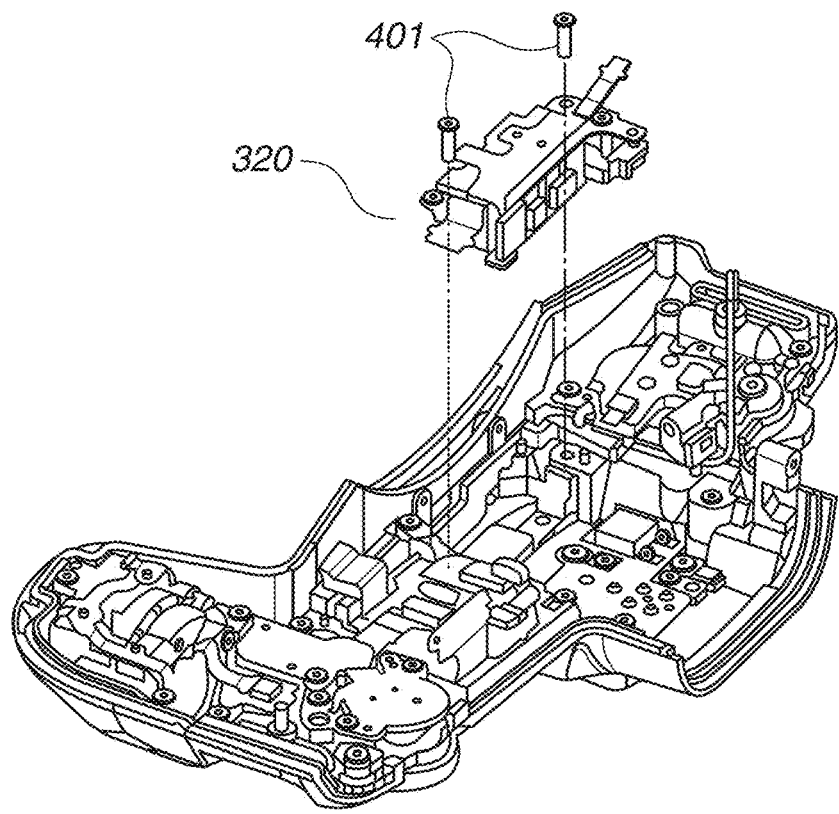

FIG. 4A is an external perspective view of the top cover unit 110. FIG. 4B is an exploded perspective view of the top cover unit 110.

The top cover unit 110 includes a top cover member 111 covering a top surface of the camera 100, the power switch 103, and the shutter button 104.

As illustrated in FIG. 4B, the shake detection unit 320 is fastened to a center portion of the top cover member 111 with screws 401.

<Exploded Perspective View of Shake Detection Unit>

Figure 5A:
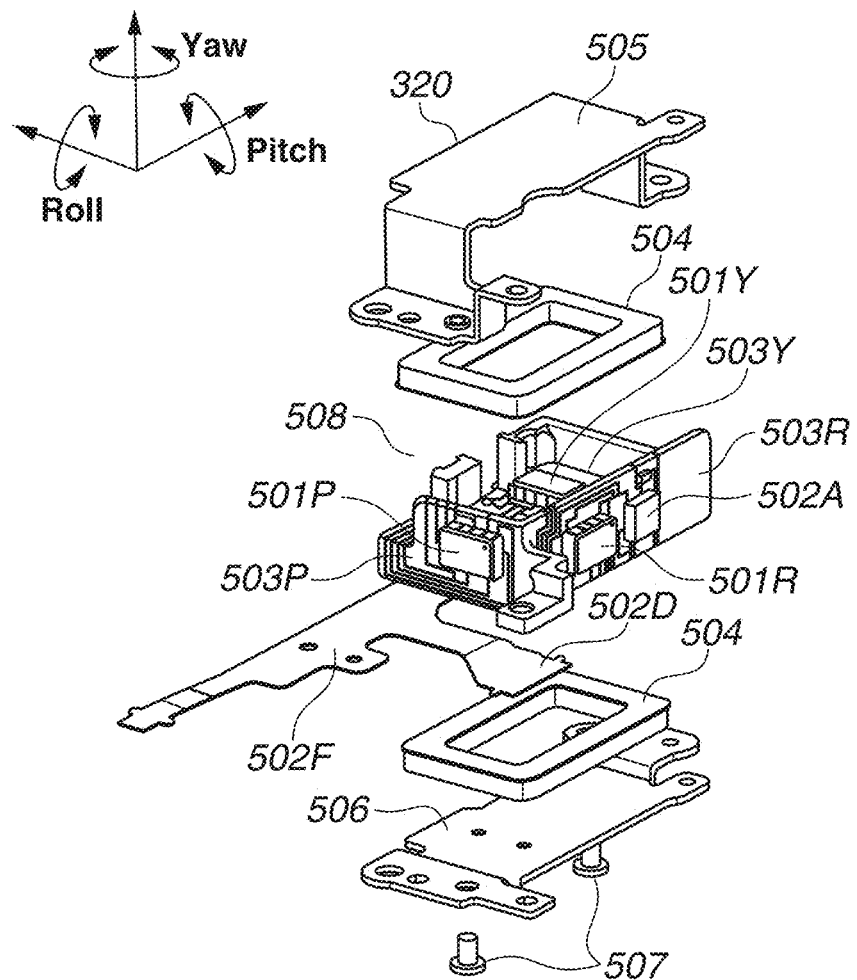
FIG. 5A is an exploded perspective view of a shake detection unit according to the first exemplary embodiment.
Figure 5B:
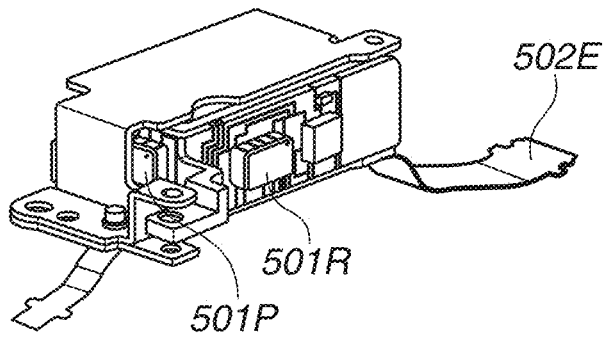
FIGS. 5B and 5C are side views of the shake detection unit according to the first exemplary embodiment.
Figure 5C:
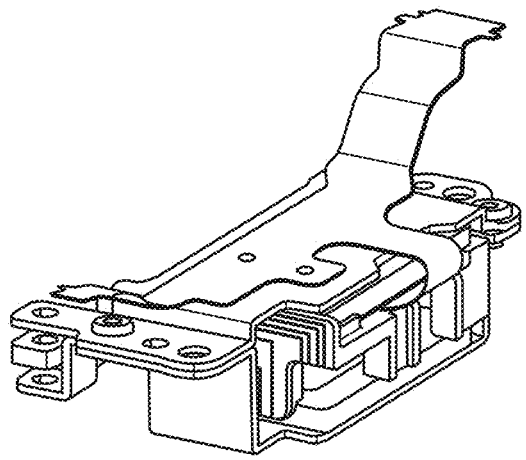

FIG. 5A is an exploded perspective view of the shake detection unit 320. FIGS. 5B and 5C are external perspective views of the shake detection unit 320.

The shake detection unit 320 includes plates 505 and 506, two buffer members 504, a sensor module 508, and a flexible substrate 502F.

The sensor module 508 includes gyro sensors 501P, 501R, and 501Y for measuring an angular velocity, and an acceleration sensor 502A for detecting acceleration.

The sensor module 508 further includes passive elements 502R (refer to FIG. 6B), such as a resistor and a capacitor, for driving the three gyro sensors 501P, 501R, and 501Y and the acceleration sensor 502A.

The flexible substrate 502F includes terminal portions 502D and 502E.

The terminal portion 502D is connected to a connector 502C (refer to FIG. 6B) included in the sensor module 508.

The terminal portion 502E is electrically connected with a connector (not illustrated) forming a part of a path to the system control unit 307.

With this configuration, the sensor module 508 and the system control unit 307 are capable of appropriately performing various types of communication via the flexible substrate 502F.

Through this communication, the system control unit 307 is capable of acquiring detection values detected by the gyro sensors 501P, 501R, and 501Y and the acceleration sensor 502A.

The two buffer members 504 are formed of an elastic material, such as a sponge, that absorbs vibration.

The shake detection unit 320 includes the two buffer members 504.

The two buffer members 504 are arranged on different surfaces facing the sensor module 508 to sandwich the sensor module 508.

In the present exemplary embodiment, the two buffer members 504 are arranged on the surfaces substantially parallel to a primary surface 503Y that is a surface on which the gyro sensor 501Y is arranged.

The plates 505 and 506 include the surfaces substantially parallel to the primary surface 503Y. The plates 505 and 506 sandwich the sensor module 508 and the two buffer members 504.

The plate 505 and the sensor module 508 compress one of the two buffer members 504, and the plate 506 and the sensor module 508 compress the other buffer member 504.

The plates 505 and 506 are thus configured not to make contact with the sensor module 508.

The shake detection unit 320 is completed by fastening of the plates 505 and 506 using screws 507.

<External Perspective View of Sensor Module>

Figure 6A:
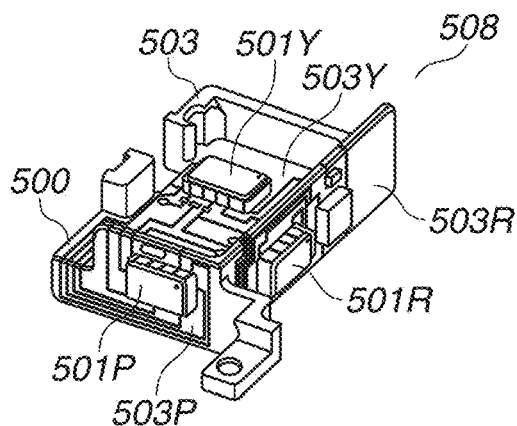
FIGS. 6A and 6B are external perspective views of a sensor module according to the first exemplary embodiment.
Figure 6B:
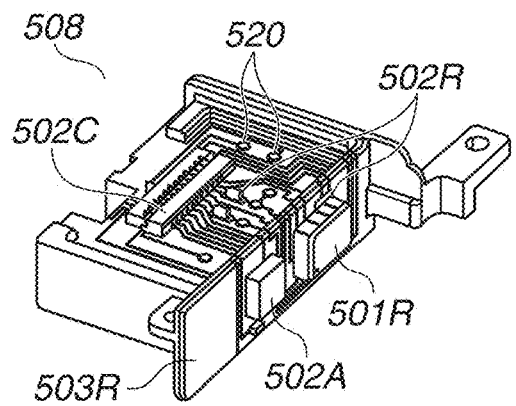
Figure 6C:
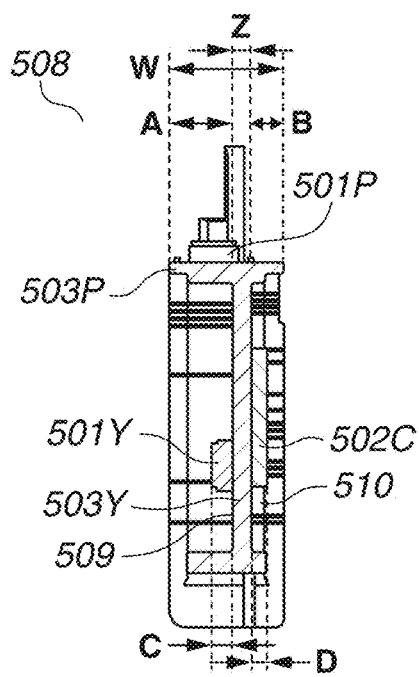
FIG. 6C is a cross-sectional view of a main part of the sensor module according to the first exemplary embodiment.

FIGS. 6A and 6B are external perspective views of the sensor module 508. FIG. 6C is a cross-sectional view of a main part of the sensor module 508.

A base member 503 illustrated in FIG. 6A holds the gyro sensors 501P, 501R, and 501Y at predetermined positions, and is molded using a material such as plastic or liquid crystal polymer (LCP).

The base member 503 includes a first side wall 503P substantially orthogonal to a rotational axis of the pitch direction, a second side wall 503R substantially orthogonal to a rotational axis of the roll direction, and the primary surface 503Y substantially orthogonal to a rotational axis of the yaw direction.

In other words, the first side wall 503P is orthogonal to the primary surface 503Y, and the second side wall 503R is orthogonal to each of the primary surface 503Y and the first side wall 503P.

The gyro sensor 501P is mounted on the first side wall 503P, the gyro sensor 501R is mounted on the second side wall 503R, and the gyro sensor 501Y is mounted on the primary surface 503Y.

The gyro sensors 501P, 501R, and 501Y are directly soldered to land portions of pattern wiring 500 on the base member 503.

The sensor module 508 has the above-described configuration.

The gyro sensor 501P thus detects the shake and the shake amount of the camera 100 in the pitch direction, the gyro sensor 501R detects the shake and the shake amount of the camera 100 in the roll direction, and the gyro sensor 501Y detects the shake and the shake amount of the camera 100 in the yaw direction.

The connector 502C is mounted on a surface of the primary surface 503Y that is opposite to a surface of the primary surface 503Y on which the gyro sensor 501Y is mounted.

Hereinafter, the surface of the primary surface 503Y on which the gyro sensor 501Y is mounted will be referred to as a first surface 509, and the surface of the primary surface 503Y on which the connector 502C is mounted will be referred to as a second surface 510.

The acceleration sensor 502A is also mounted on the second side wall 503R.

As illustrated in FIGS. 6A and 6B, the pattern wiring 500 is directly formed on the base member 503.

The pattern wiring 500 is formed using a molded interconnect device (MID) technique.

The MID technique is a technique of forming a pattern by irradiating a predetermined portion of a base member with laser, and coating the irradiated portion with metal plating.

The gyro sensors 501P, 501R, and 501Y and the acceleration sensor 502A for shake detection, and the passive elements 502R for driving these sensors will be described next.

The gyro sensors 501P, 501R, and 501Y, the acceleration sensor 502A, and the passive elements 502R are directly mounted by soldering on the mounting land portions provided by the pattern wiring 500 on the base member 503.

The pattern wiring 500 enables appropriate electrical connection between the gyro sensors 501P, 501R, and 501Y, the acceleration sensor 502A, the passive elements 502R, and the connector 502C.

FIG. 6C is a cross-sectional view of the main part of the sensor module 508.

Assuming that a thickness of the primary surface 503Y is Z, and the shorter one of lengths of the first side wall 503P and the second side wall 503R in a direction orthogonal to the primary surface 503Y is W, the length W is larger than the thickness Z.

Assume that the higher one of a height of the first side wall 503P from the first surface 509 and a height of the second side wall 503R from the first surface 509 is A, and the higher one of a height of the first side wall 503P from the second surface 510 and a height of the second side wall 503R from the second surface 510 is B.

In addition, assume that a height from the first surface 509 to a top surface of the gyro sensor 501Y is C, and a height from the second surface 510 to a top surface of the connector 502C is D.

In this case, the height A is equal to or larger than the height C, and the height B is equal to or larger than the height D.

In the present exemplary embodiment, the above-described configuration is employed.

Thus, the gyro sensor 501Y and the connector 502C do not protrude from the higher one of the first side wall 503P and the second side wall 503R in a direction vertical to the primary surface 503Y.

Therefore, a height of the sensor module 508 in the direction orthogonal to the primary surface 503Y can be reduced.

Figure 6D:
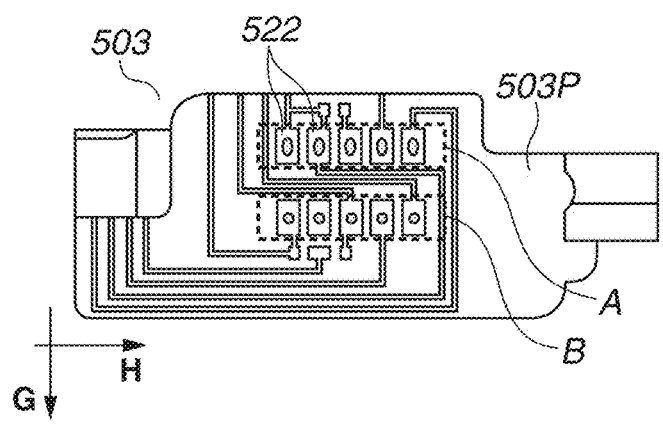
FIG. 6D is a plan view of a land shape according to the first exemplary embodiment.

FIG. 6D is an enlarged view of lands 522 for mounting the gyro sensor 501P that are formed on the first side wall 503P.

The gyro sensor 501P is mounted onto the first side wall 503P by reflow mounting using solder.

In FIG. 6D, an arrow G indicates a gravity direction (a direction G) in melting a solder paste in the reflow mounting of the gyro sensor 501P on the first side wall 503P.

In addition, an arrow H indicates a direction (a direction H) that is orthogonal to the gravity direction and parallel to the first side wall 503P.

In normal reflow mounting on a flat-shaped substrate, gravity constantly acts on a component to be mounted, vertically with respect to a surface on which the component is to be mounted.

However, in the shake detection unit 320 according to the present exemplary embodiment, the gyro sensors 501P, 501R, and 501Y are mounted on the respective three surfaces (the first side wall 503P, the second side wall 503R, and the primary surface 503Y) that are orthogonal to each other.

Accordingly, in the reflow mounting, the gravity acts on at least one of the gyro sensors 501P, 501R, and 501Y in a direction parallel to the mounting surface.

In the present exemplary embodiment, the gyro sensor 501P is mounted onto the first side wall 503P in a state where the gravity acts in the direction indicated by the arrow G.

Thus, when the solder melts, the mounting position may shift from a desired mounting position in the direction indicated by the arrow G, under the influence of the gravity in the direction indicated by the arrow G.

In view of the foregoing, in land arrays A and B each including five lands 522, the amount of solder to be applied to the land array B on the lower side in FIG. 6D is made smaller than the amount of solder to be applied to the land array A on the upper side.

As a result, surface tension of the solder applied to the land array A is larger than surface tension of the solder applied to the land array B.

With this configuration, it is possible to prevent mounting misalignment caused by the gravity in the reflow mounting, by changing the direction of the force acting on the gyro sensor 501P, to a reverse direction of the direction indicated by the arrow G, using the surface tension of the solder, and cancelling out the gravity acting on the gyro sensor 501P in the direction indicated by the arrow G.

As illustrated in FIGS. 6A and 6B, the base member 503 is provided with a plurality of vias 520 for electrically connecting one surface and the other surface of the primary surface 503Y.

Figure 6E:
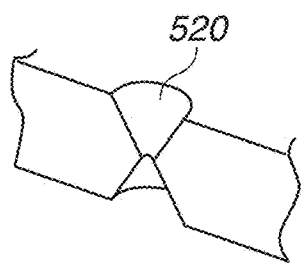
FIG. 6E is a cross-sectional perspective view of a via portion according to the first exemplary embodiment.
Figure 6F:
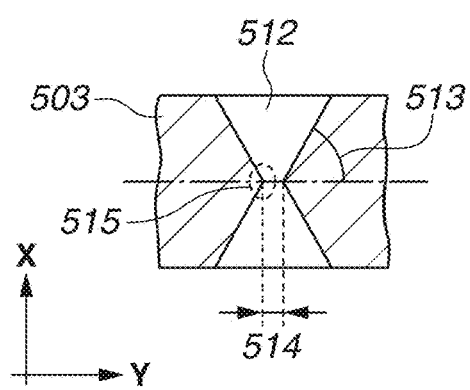
FIG. 6F is a cross-sectional enlarged view of the via portion according to the first exemplary embodiment.

FIG. 6E is an enlarged cross-sectional perspective view of the base member 503 in a portion where the vias 520 are arranged. FIG. 6F is an enlarged cross-sectional view of the base member 503 in the portion where the vias 520 are arranged.

For improving productivity, a structure of a mold for molding the base member 503 may be such that the base member 503 is demolded in the direction vertical to the primary surface 503Y because the primary surface 503Y is the largest planar surface.

For this reason, in the present exemplary embodiment, arranging all the vias 520 on the primary surface 503Y enables a direction of a hole 512 of each of the vias 520 to correspond to the demolding direction, thereby simplifying the mold structure.

In the present exemplary embodiment, as illustrated in FIGS. 6E and 6F, the hole 512 of each of the vias 520 is formed into a shape in which two frustums are stacked symmetrically about a center in a thickness direction of the primary surface 503Y.

Each of the frustums has a shape in which the diameter is smallest at the center in the thickness direction of the primary surface 503Y, and becomes larger in a direction away from the center in the thickness direction.

Assuming that a diameter of a circle at a via vertex 515 is a via diameter 514, the hole 512 is opened up to the surfaces of the base member 503 with the via diameter 514 increasing at a fixed via angle 513 starting from the via vertex 515, and penetrates through the base member 503.

On an internal wall of the hole 512, a pattern is directly wired from one surface to the other surface of the primary surface 503Y, using the MID technique.

Accordingly, patterns wired on one surface and the other surface of the base member 503 are electrically connected via the vias 520.

The hole 512 according to the present exemplary embodiment has the above-described shape instead of a simple cylindrical shape penetrating through the primary surface 503Y, in order to facilitate the laser irradiation of the internal wall of the hole 512 for pattern formation.

<Side View of Sensor Module>

Figure 7A:
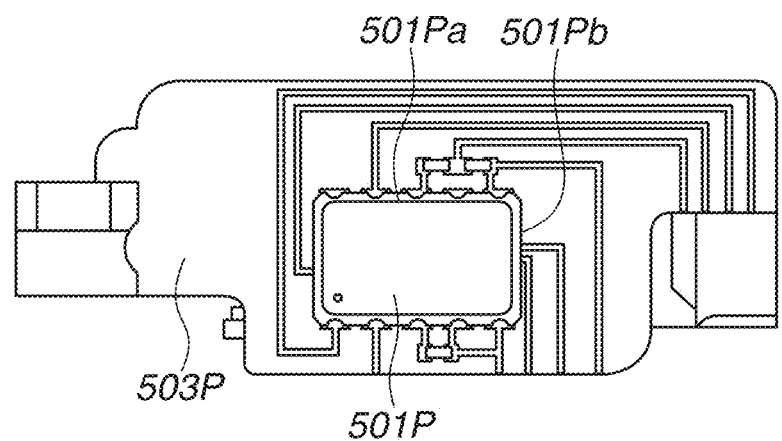
FIGS. 7A and 7B are side views of the sensor module according to the first exemplary embodiment.
Figure 7B:
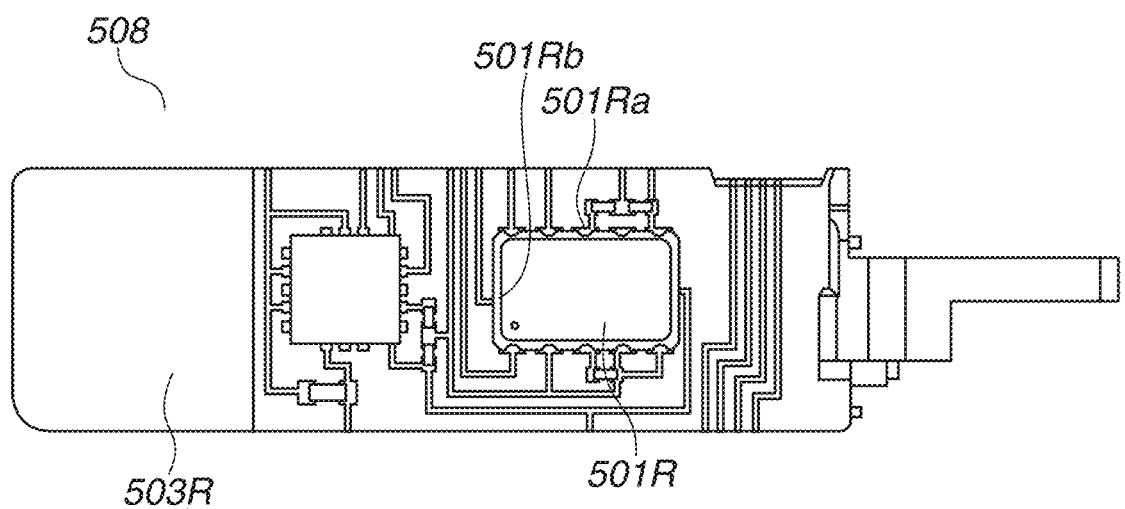

FIGS. 7A and 7B are side views of the sensor module 508. FIG. 7A illustrates the first side wall 503P, and FIG. 7B illustrates the second side wall 503R.

The gyro sensors 501Y, 501R, and 501P according to the present exemplary embodiment are substantially rectangles when viewed from directions vertical to the respective surfaces (the primary surface 503Y, the second side wall 503R, and the first side wall 503P) on which the gyro sensors 501Y, 501R, and 501P are mounted.

Thus, the gyro sensor 501R has long sides 501Ra and short sides 501Rb, and the gyro sensor 501P has long sides 501Pa and short sides 501Pb.

In the present exemplary embodiment, the gyro sensors 501R and 501P are attached to the base member 503 in such a manner that the short sides 501Rb and the short sides 501Pb are parallel to the direction orthogonal to the primary surface 503Y.

The heights of the first side wall 503P and the second side wall 503R in the direction orthogonal to the primary surface 503Y can be accordingly reduced.

Definition of a frustum according to an exemplary embodiment of the present disclosure will be described now.

The frustum is a three-dimensional object obtained by removing, from a cone or pyramid, a similar reduced cone or pyramid having the same vertex as that of the cone or pyramid. In other words, the frustum is a three-dimensional object surrounded by a conical or pyramidal surface and two parallel planar surfaces.

A frustum formed from a circular cone will be referred to as a circular frustum, a frustum formed from a pyramid will be referred to as a pyramid frustum, and a frustum formed from an n-sided pyramid will be referred to as an n-sided frustum. A pyramid such as a three-sided pyramid, a four-sided pyramid, a six-sided pyramid, or an eight-sided pyramid can be applied as the n-sided pyramid.

In a second exemplary embodiment to be described below, a more desirable circular frustum will be used as an example.

The present exemplary embodiment will be described with reference to FIGS. 8A to 8C.

Figure 8A:
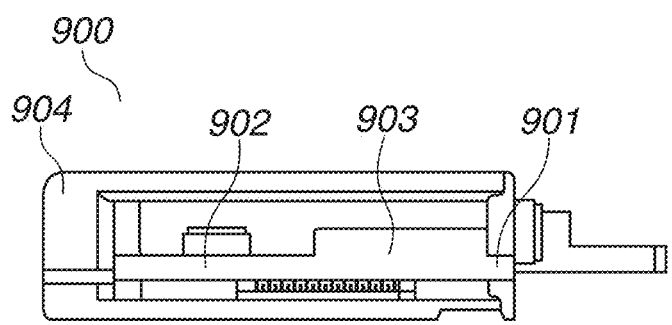
FIGS. 8A and 8B are a side view and a perspective view of a sensor module according to a second exemplary embodiment, respectively.

FIG. 8A is a side view of a sensor module 900.

Figure 8B:
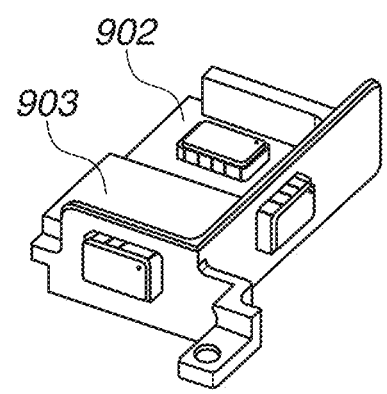

FIG. 8B is an external perspective view of the sensor module 900.

Figure 8C:
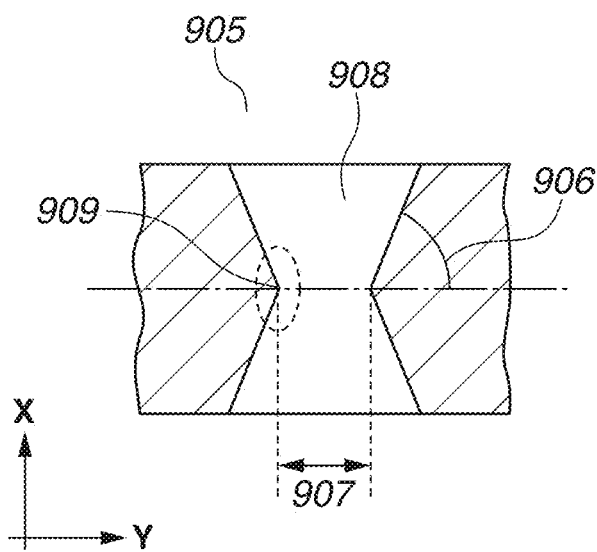
FIG. 8C is a cross-sectional view of a via according to the second exemplary embodiment.

FIG. 8C is a cross-sectional view of a via arranged in a second portion 903 of a primary surface 901 of a base member 904 of the sensor module 900.

The sensor module 900 is configured to mount the gyro sensors 501Y, 501R, and 501P on the base member 904.

A thickness of a first portion 902 of the primary surface 901 of the base member 904 is the same as that of the primary surface 503Y of the base member 503 according to the first exemplary embodiment.

A thickness of the second portion 903 of the primary surface 901 is thicker than the thickness of the primary surface 503Y of the base member 503 according to the first exemplary embodiment. With this configuration, the base member 904 according to the present exemplary embodiment has higher strength than that of the base member 503 according to the first exemplary embodiment.

In FIGS. 8A to 8C, illustration of the pattern wiring 500 and the passive elements 502R such as a resistor and a capacitor is omitted for ease of understanding.

The primary surface 901 of the base member 904 includes a plurality of the vias (the first vias) 520 having a first shape and a plurality of second vias 905 having a second shape, which are provided to electrically connect one surface and the other surface of the primary surface 901.

The first vias 520 having the first shape are formed in the first portion 902, and the second vias 905 having the second shape are formed in the second portion 903.

The first shape of the first vias 520 is the same as the shape described in the first exemplary embodiment, and the description thereof will thus be omitted.

The second vias 905 and the first vias 520 have similar shapes in that each hole 908 is formed into a shape in which two frustums are stacked, but differ in that a via angle 906 is larger than the via angle 513 of each of the first vias 520.

On an internal wall of the hole 908, a pattern is directly wired from one surface to the other surface of the primary surface 901, using the MID technique.

Thus, patterns wired on one surface and the other surface of the base member 904 are electrically connected via the second vias 905.

If the sensor module 900 is mounted on the camera 100 and is operated, a temperature of the sensor module 900 rises during the operation and drops when the operation stops.

The rise and drop of the temperature causes the base member 904 of the sensor module 900 to repeat thermal expansion and thermal contraction.

The expansion and contraction of the base member 904 causes stress to be applied to the pattern formed on the internal wall of the hole 908.

In particular, large stress is applied to the pattern at a via vertex 909 due to stress concentration, which causes the pattern to break.

As a thickness of the primary surface 901 increases, the stress applied to the pattern at the via vertex 909 increases. On the other hand, as a value of the via angle 906 increases, the stress applied to the pattern at the via vertex 909 decreases.

In the present exemplary embodiment, a case where the first vias 520 having the first shape are arranged in the second portion 903 having a large thickness will be considered.

In this case, large stress is applied to the pattern at the via vertex 515 as compared with the case where the first vias 520 are arranged in the first portion 902, and this can cause the pattern to break on the internal wall.

For this reason, the second vias 905 having the second shape with which a reduced stress at the via vertex 909 can be expected more than the first vias 520 having the first shape are arranged in the second portion 903.

If the via angle 906 is changed to an obtuse angle, laser irradiation of the internal wall of each of the holes 908 for pattern formation can be difficult.

Thus, to facilitate the laser irradiation of the internal wall of the hole 908, a via diameter 907 can be increased.

The present exemplary embodiment will be schematically described next.

The base member 904 is a molded component in which the pattern wiring 500 is directly formed.

The base member 904 includes the second vias 905 for electrically connecting one surface of the primary surface (the base surface) 901 of the base member 904, and the other surface of the primary surface (the base surface) 901 on an opposite side of the one surface.

In each of the second vias 905, a shape at a lower end of a first hole having a circular frustum shape and a shape at an upper end of a second hole having a circular frustum shape are the same as each other.

Each of the second vias 905 has a structure in which a pattern is formed from one surface to the other surface of the primary surface (the base surface) 901 on the internal wall of the hole 908 having a shape in which the first hole and the second hole are stacked in such a manner that the lower end of the first hole and the upper end of the second hole are in contact with each other.

The first hole and the second hole have the circular frustum shapes becoming wider as getting closer to one surface and the other surface of the primary surface (the base surface) 901 from a portion at which the lower end of the first hole and the upper end of the second hole are in contact with each other.

The smaller one (which is twice as large as the via angle 513 or 906) of angles formed by a generatrix of the first hole and a generatrix of the second hole is smaller in the thin region of the base member 904 than in the thick region of the base member 904.

The base member 904 includes the second vias 905 for electrically connecting one surface of the primary surface (the base surface) 901 of the base member 904, and the other surface of the primary surface (the base surface) 901 on the opposite side of the one surface.

In each of the second vias 905, a shape at a lower end of a first hole having a polyangular frustum shape and a shape at an upper end of a second hole having a polyangular frustum shape are the same as each other.

Each of the second vias 905 has a structure in which a pattern is formed from one surface to the other surface of the primary surface (the base surface) 901 on the internal wall of the hole 908 having a shape in which the first hole and the second hole are stacked in such a manner that the lower end of the first hole and the upper end of the second hole are in contact with each other.

The first hole and the second hole have the polyangular frustum shapes becoming wider as getting closer to one surface and the other surface of the primary surface (the base surface) 901 from a portion at which the lower end of the first hole and the upper end of the second hole are in contact with each other.

The smaller one (which is twice as large as the via angle 513 or 906) of angles formed by a side surface of the first hole and a side surface of the second hole that is in contact with the side surface of the first hole is smaller in the thin region of the base member 904 than in the thick region of the base member 904.

A third exemplary embodiment of the present disclosure will be described next with reference to FIGS. 9A to 9D.

In the second exemplary embodiment, it has been described that, in a case where the via forming surface is thick, changing the via angle 906 to an obtuse angle is effective from the aspect of preventing the pattern break.

In the present exemplary embodiment, an example where a recessed shape is provided near a hole 1002 of each of vias 1000 formed in a base member 1001 of the shake detection unit 320 will be described.

Figure 9A:
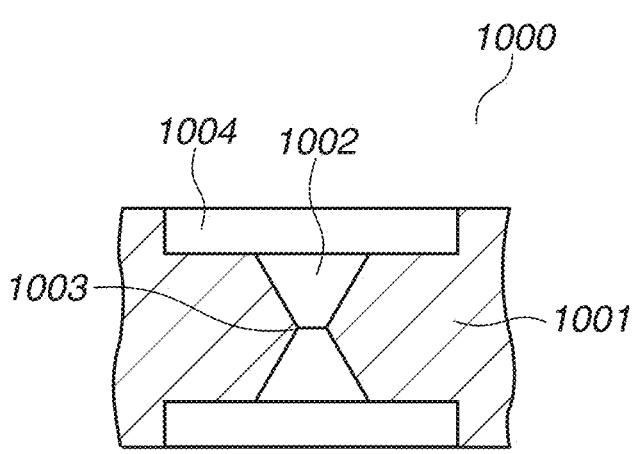
FIG. 9A is a cross-sectional enlarged view of a via according to a third exemplary embodiment.
Figure 9B:
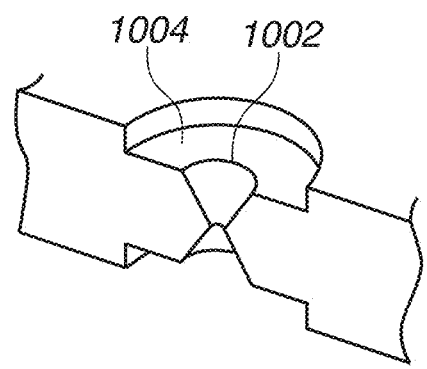
FIGS. 9B and 9C are cross-sectional perspective views of the via according to the third exemplary embodiment.
Figure 9C:
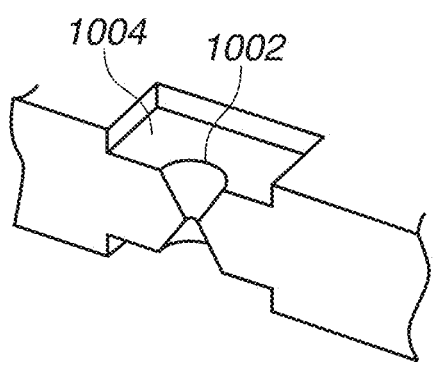

FIG. 9A is a cross-sectional view of each of the vias 1000 formed in the base member 1001. FIGS. 9B and 9C are cross-sectional perspective views of each of the vias 1000 formed in the base member 1001.

Figure 9D:
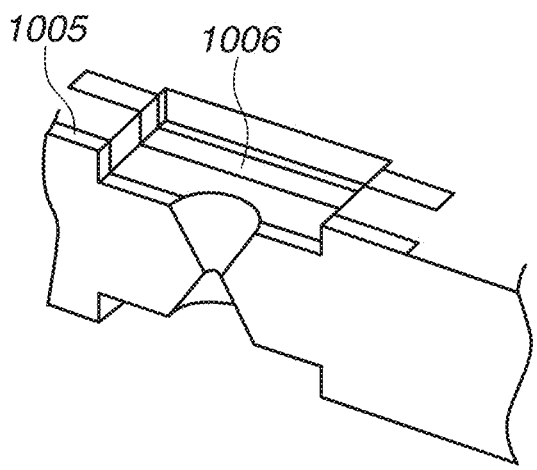
FIG. 9D is a schematic view of pattern wiring according to the third exemplary embodiment.

FIG. 9D is a schematic diagram of pattern wiring formed around each of the vias 1000.

The vias 1000 are similar to the vias 520 according to the first exemplary embodiment in that the hole 1002 is formed into a shape in which two frustums are stacked.

However, the vias 1000 are different from the vias 520 in that a recessed shape is provided around each of the vias 1000 in the base member 1001.

Because the base member 1001 is shaped in this way, the base member 1001 at the via arrangement portion is locally thin, and stress applied to a pattern at a via vertex 1003 can be alleviated.

The recessed shape may be a recessed shape 1004 illustrated in FIG. 9B or 9C, but is not limited thereto. Another effect of the provision of the recessed shape 1004 is reduction of a hole diameter of the hole 1002 of each of the vias 1000 on the surface of the base member 1001.

This effect ensures a wider wiring area on the surface of the base member 1001.

This is because another signal line 1006 can also be arranged near a signal line 1005 electrically connecting with the vias 1000, as illustrated in FIG. 9D.

The present exemplary embodiment will be schematically described next.

The base member 1001 is an injection-molded component in which pattern wiring is directly formed. In other words, the base member 1001 is an MID.

The base member 1001 includes the vias 1000 for electrically connecting one surface of the primary surface (the base surface) 503Y of the base member 1001, and the other surface of the primary surface (the base surface) 503Y on the opposite side of the one surface.

In each of the vias 1000, a shape at a lower end of a first hole having a frustum shape and a shape at an upper end of a second hole having a frustum shape are the same as each other.

Each of the vias 1000 has a structure in which a pattern is formed from one surface to the other surface of the primary surface (the base surface) 503Y on the internal wall of the hole 1002 having a shape in which the first hole and the second hole are stacked in such a manner that the lower end of the first hole and the upper end of the second hole are in contact with each other.

The first hole and the second hole have the frustum shapes becoming wider as getting closer to one surface and the other surface of the primary surface (the base surface) 503Y from a portion at which the lower end of the first hole and the upper end of the second hole are in contact with each other.

A thickness of the base member 1001 at the recessed shape 1004 around a portion where each of the vias 1000 is arranged is thinner than a thickness of the base member 1001 in a portion where the vias 1000 are not arranged.

A fourth exemplary embodiment of the present disclosure will be described next with reference to FIGS. 10A and 10B.

In the present exemplary embodiment, an example where a hole 1100 of each of vias 1107 formed in a base member 1101 of the shake detection unit 320 has a shape in which frustums are not stacked symmetrically about a center in a thickness direction of the base member 1101 will be described.

Figure 10A:
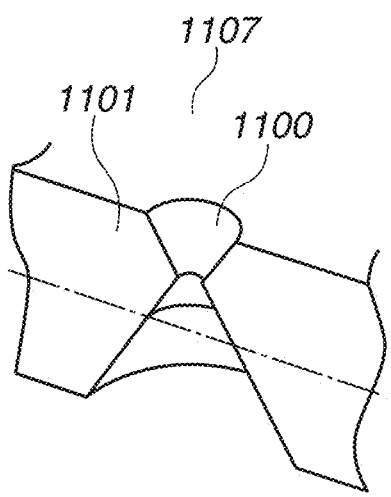
FIGS. 10A and 10B are a cross-sectional perspective view and a cross-sectional view of a via according to a fourth exemplary embodiment, respectively.
Figure 10B:
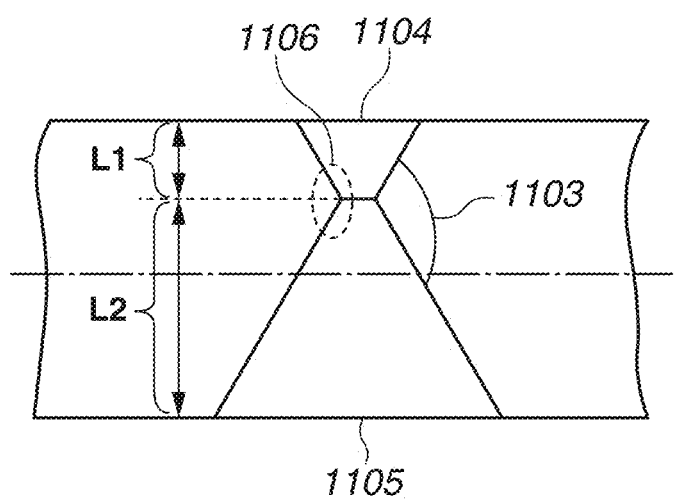

FIG. 10A is a cross-sectional perspective view of the base member 1101 near the vias 1107 directly formed in the base member 1101. FIG. 10B is a cross-sectional view of the base member 1101 near the vias 1107.

In the hole 1100, assume that a distance from a via vertex 1106 to one surface of the base member 1101 is L1, and a distance from the via vertex 1106 to the other surface of the base member 1101 is L2.

In this case, two frustum shapes are formed at a via angle 1103 that satisfies the relation of L2>L1.

In the present exemplary embodiment, with this configuration, a position of the via vertex 1106 where stress concentration occurs is displaced from the center in the thickness direction of the base member 1101 at which the stress is largest, so that the stress to be applied to a pattern at the via vertex 1106 can be alleviated.

While a via diameter 1105 on one surface of the base member 1101 is larger, a via diameter 1104 on the other surface of the base member 1101 can be made smaller.

Thus, arranging the side having the smaller via diameter 1104 on a side having a higher pattern wiring density, pattern wiring efficiency can be enhanced.

The present exemplary embodiment will be schematically described next.

The base member 1101 is an injection-molded component in which pattern wiring is directly formed.

The base member 1101 includes the vias 1107 for electrically connecting one surface of the primary surface (the base surface) 503Y of the base member 1101, and the other surface of the primary surface (the base surface) 503Y on the opposite side of the one surface.

In each of the vias 1107, a shape at a lower end of a first hole having a frustum shape and a shape at an upper end of a second hole having a frustum shape are the same as each other.

Each of the vias 1107 has a structure in which a pattern is formed from one surface to the other surface of the primary surface (the base surface) 503Y on the internal wall of the hole 1100 having a shape in which the first hole and the second hole are stacked in such a manner that the lower end of the first hole and the upper end of the second hole are in contact with each other.

The first hole and the second hole have the frustum shapes becoming wider as getting closer to one surface and the other surface of the primary surface (the base surface) 503Y from a portion at which the lower end of the first hole and the upper end of the second hole are in contact with each other.

The width of the first hole in the direction vertical to the primary surface (the base surface) 503Y, i.e., the distance L1 and the width of the second hole in the direction vertical to the primary surface (the base surface) 503Y, i.e., the distance L2 are different from each other.

When the base member 1101 is viewed from a direction where the primary surface (the base surface) 503Y extends, a thickness of the base member 1101 at the recessed shape 1004 around a portion where each of the vias 1107 is arranged is thinner than a thickness of the base member 1101 in a portion where the vias 1107 are not arranged.

A fifth exemplary embodiment of the present disclosure will be described next with reference to FIG. 11.

Figure 11:
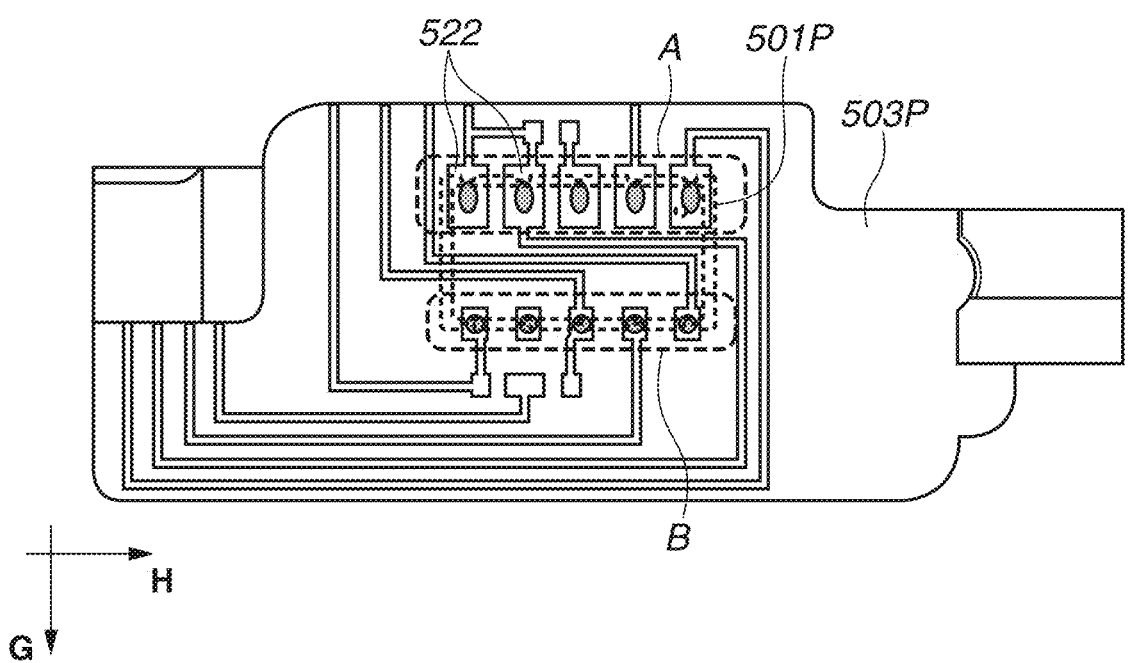
FIG. 11 is a plan view of a land shape according to a fifth exemplary embodiment.

In FIG. 11, illustration of the gyro sensor 501P and the passive elements 502R such as a resistor and a capacitor is omitted for ease of understanding.

<Enlarged View of Gyro Sensor Mounting Lands on First Side Wall>

FIG. 11 is an enlarged view of the lands 522 for mounting the gyro sensor 501P that are formed on the first side wall 503P.

The gyro sensor 501P is mounted onto the first side wall 503P by reflow mounting using solder.

In FIG. 11, an arrow G indicates a gravity direction (a direction G) in melting a solder paste in the reflow mounting of the gyro sensor 501P on the first side wall 503P.

In FIG. 11, an arrow H indicates a direction (a direction H) that is orthogonal to the gravity direction and parallel to the first side wall 503P.

In the present exemplary embodiment, the gyro sensor 501P is mounted onto the first side wall 503P in a state where gravity acts in the direction indicated by the arrow G.

Thus, when the solder melts, the mounting position may shift from a desired mounting position in the direction indicated by the arrow G, under the influence of the gravity in the direction indicated by the arrow G.

In view of the foregoing, in land arrays A and B each including the five lands 522, the amount of solder to be applied to the land array B on the lower side in FIG. 11 is made smaller than the amount of solder to be applied to the land array A on the upper side.

As a result, surface tension of the solder applied to the land array A is larger than surface tension of the solder applied to the land array B.

With this configuration, it is possible to prevent mounting misalignment caused by the gravity in the reflow mounting, by changing the direction of the force acting on the gyro sensor 501P, to the reverse direction of the direction indicated by the arrow G, using the surface tension of the solder, and cancelling out the gravity acting on the gyro sensor 501P in the direction indicated by the arrow G.

In this case, a size of each of the lands 522 included in the land array B on the lower side in FIG. 11 is made smaller than a size of each of the lands 522 included in the land array A.

Thus, the size of each of the lands 522 is suitable for the amount of solder to be applied, so that protrusion of the solder applied to the land array A, where the amount of solder applied is large, from the lands 522 can be prevented.

The present exemplary embodiment will be schematically described next.

The base member 503 is a molded component in which the pattern wiring 500 is directly formed.

On different surfaces (the primary surface 503Y and the first side wall 503P) of the base member 503 that are not parallel to each other, land groups for solder mounting of the respective electronic components (the gyro sensors 501Y and 501P) are formed.

In at least one of the land groups, the first land array (the land array A) in which the plurality of lands 522 is arrayed in the first direction (the direction H), and the second land array (the land array B) in which the plurality of lands 522 is arrayed in the first direction (the direction H) are arranged in the second direction (the direction G) different from the first direction.

When viewed from a normal direction of a base surface of the base member 503, the first land array (the land array A) is arranged above the second land array (the land array B) in the second direction.

An area of each of the lands 522 included in the first land array (the land array A) is larger than an area of each of the lands 522 included in the second land array (the land array B).

When viewed from the normal direction of the base surface of the base member 503, the first land array (the land array A) is arranged above the second land array (the land array B) in the second direction.

The amount of solder applied to the lands 522 included in the first land array (the land array A) is larger than the amount of solder applied to the lands 522 included in the second land array (the land array B).

In FIG. 11, the amount of solder applied to a region where the area of each of the lands 522 included in the first land array (the land array A) is large is larger than the amount of solder applied to a region where the area of each of the lands 522 included in the second land array (the land array B) is small.

As a modified example of FIG. 11, the present exemplary embodiment can also be applied to a configuration in which an area of each of lands included in an upper third land array and an area of each of lands included in a lower fourth land array are the same as each other.

In this case, the amount of solder applied to the lands included in the upper third land array is larger than the amount of solder applied to the lands included in the lower fourth land array.

The action and effects described with reference to FIG. 11 can be obtained.

The second direction (the direction G) is orthogonal to the first direction.

On different surfaces (the primary surface 503Y and the first side wall 503P) of the base member 503 that are not parallel to each other, land groups for reflow mounting of the respective electronic components (the gyro sensors 501Y and 501P) are formed.

The second direction (the direction G) is the gravity direction in melting the solder in the reflow mounting.

A sixth exemplary embodiment of the present disclosure will be described next with reference to FIG. 12.
<Enlarged View of Gyro Sensor Mounting Lands on First Side Wall>

Figure 12:
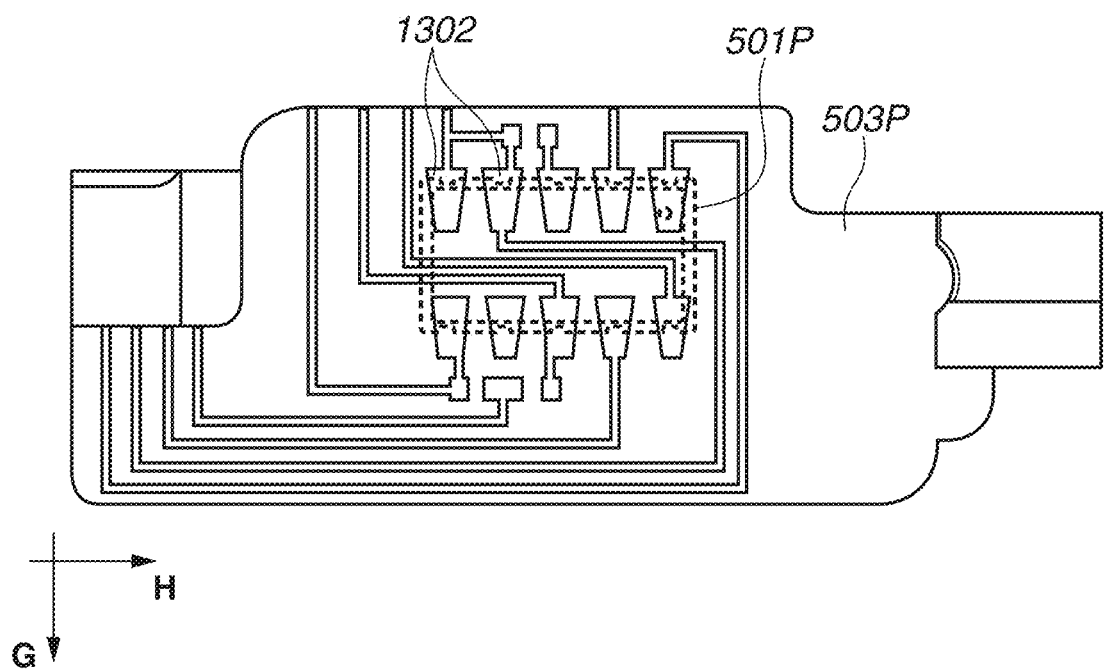
FIG. 12 is a plan view of a land shape according to a sixth exemplary embodiment.

In FIG. 12, illustration of the gyro sensor 501P and the passive elements 502R such as a resistor and a capacitor is omitted for ease of understanding.

FIG. 12 is an enlarged view of lands 1302 for mounting the gyro sensor 501P that are formed on the first side wall 503P.

The gyro sensor 501P is mounted onto the first side wall 503P by reflow mounting using solder.

In FIG. 12, an arrow G indicates a gravity direction (a direction G) in melting a solder paste in the reflow mounting of the gyro sensor 501P on the first side wall 503P.

In addition, an arrow H indicates a direction (a direction H) that is orthogonal to the gravity direction and parallel to the first side wall 503P.

In the present exemplary embodiment, the gyro sensor 501P is mounted onto the first side wall 503P in a state where gravity acts in the direction indicated by the arrow G.

Thus, when the solder melts, the mounting position may shift from a desired mounting position in the direction indicated by the arrow G, under the influence of the gravity in the direction indicated by the arrow G.

In the present exemplary embodiment, a width of each of the ten lands 1302 in total is varied in the direction indicated by the arrow G.

More specifically, each of the lands 1302 is formed into a shape in which the width becomes smaller toward the gravity direction.

As the width becomes larger, the force acting on the gyro sensor 501P increases with the surface tension of the solder.

Thus, by forming the lands 1302 into the above-described shape, the direction of the force acting on the gyro sensor 501P is changed to the reverse direction of the direction indicated by the arrow G, using the surface tension of the solder.

Cancelling out the gravity acting on the gyro sensor 501P in the direction indicated by the arrow G can prevent mounting misalignment caused by the gravity in the reflow mounting.

The present exemplary embodiment will be schematically described next.

The base member 503 is a molded component in which the pattern wiring 500 is directly formed.

On different surfaces (the primary surface 503Y and the first side wall 503P) of the base member 503 that are not parallel to each other, land groups for solder mounting of the respective electronic components (the gyro sensors 501Y and 501P) are formed.

When viewed from a normal direction of a base surface of the base member 503, at least one of the land groups includes a land array in which the plurality of lands 1302 is arranged in the predetermined direction (the direction H).

When each of the lands 1302 is viewed from the normal direction of the base surface of the base member 503, in the direction G orthogonal to the predetermined direction (the direction H), the lower width of each of the lands 1302 in the predetermined direction (the direction H) is smaller than the upper width of each of the lands 1302 in the predetermined direction (the direction H).

On different surfaces (the primary surface 503Y and the first side wall 503P) of the base member 503 that are not parallel to each other, land groups for reflow mounting of the respective electronic components (the gyro sensors 501Y and 501P) are formed.

The direction G orthogonal to the predetermined direction (the direction H) is the gravity direction in melting the solder in the reflow mounting.

A seventh exemplary embodiment of the present disclosure will be described next with reference to FIG. 13.

Figure 13:
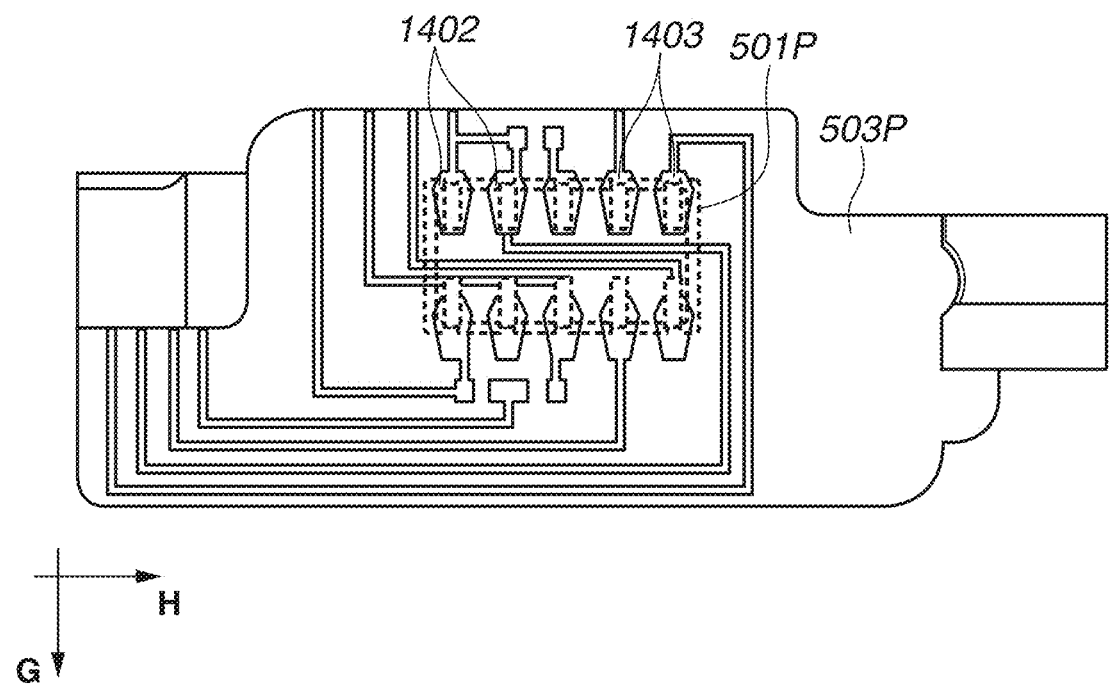
FIG. 13 is a plan view of a land shape according to a seventh exemplary embodiment.

In FIG. 13, illustration of the gyro sensor 501P and the passive elements 502R such as a resistor and a capacitor is omitted for ease of understanding.

<Enlarged View of Gyro Sensor Mounting Lands on First Side Wall>

FIG. 13 is an enlarged view of lands 1402 for mounting the gyro sensor 501P that are formed on the first side wall 503P.

The gyro sensor 501P is mounted onto the first side wall 503P by reflow mounting using solder.

In FIG. 13, a shape of the gyro sensor 501P is schematically indicated by broken lines.

Mounting terminals 1403 are connection terminals for mounting the gyro sensor 501P onto the lands 1402.

In FIG. 13, positions and shapes of the mounting terminals 1403 are schematically indicated by broken lines.

In FIG. 13, an arrow G indicates a gravity direction (a direction G) in melting a solder paste in the reflow mounting of the gyro sensor 501P on the first side wall 503P.

In addition, an arrow H indicates a direction (a direction H) that is orthogonal to the gravity direction and parallel to the first side wall 503P.

In the present exemplary embodiment, the gyro sensor 501P is mounted onto the first side wall 503P in a state where gravity acts in the direction indicated by the arrow G.

Thus, when the solder melts, the mounting position may shift from a desired mounting position in the direction indicated by the arrow G, under the influence of the gravity acting in the direction indicated by the arrow G.

In the present exemplary embodiment, a width of each of the ten lands 1402 in total is varied in the direction indicated by the arrow G.

More specifically, in the direction indicated by the arrow G, a width of each of the lands 1402 at a position corresponding to an end of the corresponding mounting terminal 1403 on an outer side of the gyro sensor 501P in the direction indicated by the arrow G is made widest.

Each of the lands 1402 is formed into a shape becoming narrower as getting away from the position corresponding to the end of the mounting terminal 1403 in the direction indicated by the arrow G.

The position where the width of each of the lands 1402 is largest is a position where the force acting on the gyro sensor 501P is largest with the surface tension of the solder.

Thus, in the reflow mounting, the end of each of the mounting terminals 1403 of the gyro sensor 501P located on the outer side of the gyro sensor 501P is kept at the position at which the width of each of the lands 1402 is largest, so that mounting misalignment caused by the gravity can be prevented.

The present exemplary embodiment will be schematically described next.

The base member 503 is a molded component in which the pattern wiring 500 is directly formed.

On different surfaces (the primary surface 503Y and the first side wall 503P) of the base member 503 that are not parallel to each other, land groups for solder mounting of the respective electronic components (the gyro sensors 501Y and 501P) are formed.

When viewed from a normal direction of a base surface of the base member 503, at least one of the land groups includes a land array A or B in which the plurality of lands 1402 is arrayed in the predetermined direction (the direction H).

Each of the lands 1402 has a structure in which, in the predetermined direction (the direction H), the portion corresponding to the end of the corresponding mounting terminal 1403 of the electronic component (the gyro sensor 501P) that is on the outer side of the electronic component (the gyro sensor 501P) has the largest width.

In the direction G orthogonal to the predetermined direction (the direction H), each of the lands 1402 has a smaller width toward an upward direction from the portion corresponding to the end of the corresponding mounting terminal 1403 of the electronic component (the gyro sensor 501P) that is on the outer side of the electronic component (the gyro sensor 501P).

When viewed from the normal direction of the base surface of the base member 503, in the direction G orthogonal to the predetermined direction (the direction H), each of the lands 1402 has a smaller width toward a downward direction from the portion corresponding to the end of the corresponding mounting terminal 1403 of the electronic component (the gyro sensor 501P) that is on the outer side of the electronic component (the gyro sensor 501P).

On different surfaces (the primary surface 503Y and the first side wall 503P) of the base member 503 that are not parallel to each other, land groups for reflow mounting of the respective electronic components (the gyro sensors 501Y and 501P) are formed.

The direction G orthogonal to the predetermined direction (the direction H) is the gravity direction in melting the solder in the reflow mounting.

An eighth exemplary embodiment of the present disclosure will be described next with reference to FIGS. 14A and 14B.

<Base Member with Pattern Wiring and Mounting Component)

Figure 14A:
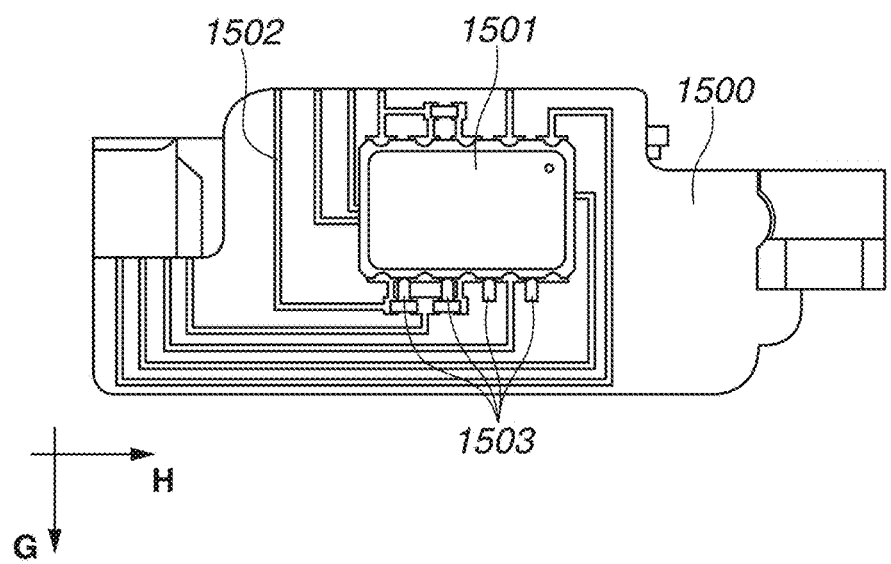
FIGS. 14A and 14B are a side view and a perspective view of a shake detection unit according to an eighth exemplary embodiment, respectively.
Figure 14B:
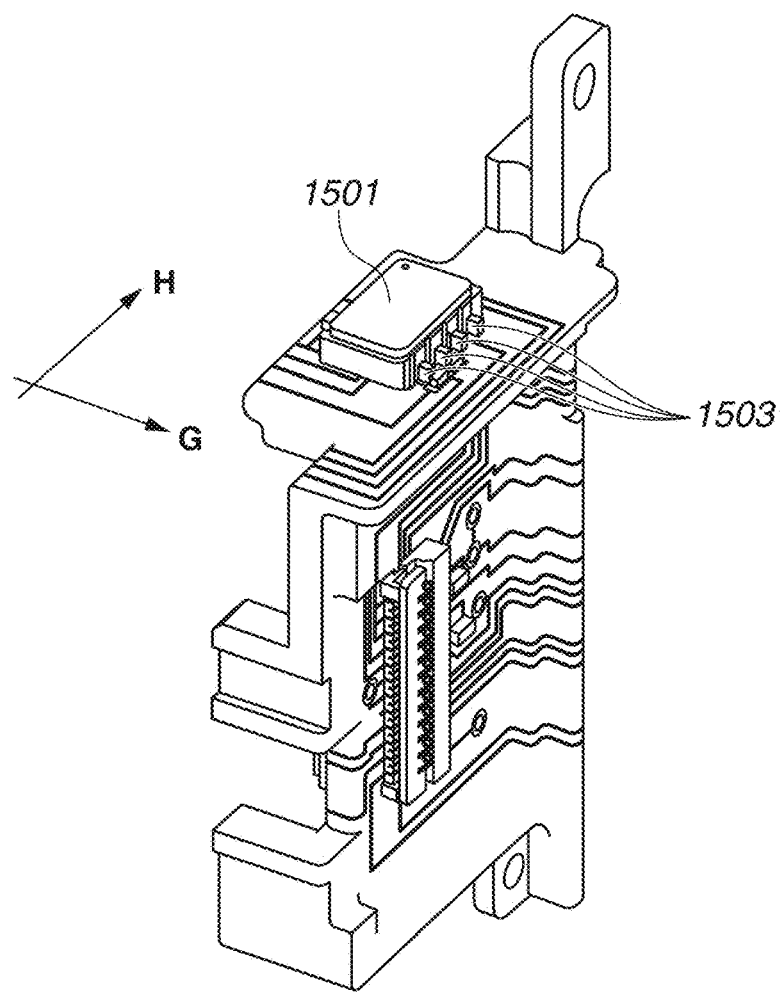

FIGS. 14A and 14B illustrate a base member 1500 having pattern wiring 1502 and a mounting component 1501 that are similar to those of the base member 503 described in the first exemplary embodiment.

On the base member 1500, the pattern wiring 1502 is directly formed, and the mounting component 1501 is directly mounted.

In FIGS. 14A and 14B, an arrow G indicates a gravity direction (a direction G) in melting a solder paste in reflow mounting of the gyro sensor 501P on the first side wall 503P.

In addition, an arrow H indicates a direction (a direction H) that is orthogonal to the gravity direction and parallel to the first side wall 503P.

On the base member 1500 on the direction G side of the mounting component 1501, standing walls 1503 having a given height are arranged in the direction H so as to be in contact with the mounting component 1501.

Thus, when the solder melts in a mounting process, it is possible to prevent the mounting component 1501 from being displaced or dropping due to the gravity.

In the present exemplary embodiment, the example where the standing walls 1503 are provided in a divided manner so as to avoid contact with the pattern wiring 1502 directly wired to the base member 1500 has been described.

Alternatively, the standing walls 1503 may be continuous without being provided in a divided manner, and the pattern wiring 1502 may be formed so as to cross the standing walls 1503.

While the exemplary embodiments of the present disclosure have been described above, the exemplary embodiments are not limited to the configurations described in the exemplary embodiments.

Materials, shapes, dimensions, configurations, numbers, and arrangement positions can be appropriately changed without departing from the gist of the present disclosure.

The exemplary embodiments of the present disclosure have been described using a camera and a smartphone as examples of an electronic device.

The exemplary embodiments can also be applied to various electronic devices such as a personal computer, a tablet terminal, a game machine, a drone, an automobile, and peripheral devices thereof.

According to the exemplary embodiments of the present disclosure, it is possible to provide a base member formed using the MID technique, and having a shape suitable for being accommodated in an electronic device.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-061120, filed Mar. 31, 2021, which is hereby incorporated by reference herein in its entirety.

What is claimed is:

1. A base member being a molded component in which pattern wiring is directly formed, the base member comprising:
　a base surface including a first surface and a second surface on an opposite side of the first surface, wherein the base surface includes a thin region and a thick region, and wherein a distance between the first surface and the second surface in the thin region is less than a distance between the first surface and the second surface in the thick region; and
　a first via in the thin region and a second via in the thick region for electrically connecting the first surface and the second surface,
　wherein, in the first via, a shape at a lower end of a first hole having a conical frustum shape and a shape at an upper end of a second hole having a conical frustum shape are identical to each other,
　wherein when viewed from a direction in which the base surface extends, the first via has a structure in which a pattern is formed from the first surface to the second surface of the base surface on an internal wall of a fifth hole having a shape in which the first hole and the second hole are stacked in such a manner that the lower end of the first hole and the upper end of the second hole are in contact with each other,
　wherein, in the second via, a shape at a lower end of a third hole having a conical frustum shape and a shape at an upper end of a fourth hole having a conical frustum shape are identical to each other,
　wherein when viewed from a direction in which the base surface extends, the second via has a structure in which a pattern is formed from the first surface to the second surface of the base surface on an internal wall of a sixth hole having a shape in which the third hole and the fourth hole are stacked in such a manner that the lower end of the third hole and the upper end of the fourth hole are in contact with each other,
　wherein, when viewed from the direction in which the base surface extends, conical frustum shape of the first hole becomes wider closer to the first surface relative to a portion at which the lower end of the first hole and the upper end of the second hole are in contact with each other,
　wherein, when viewed from the direction in which the base surface extends, the conical frustum shape of the second hole becomes wider closer to the second surface relative to the portion at which the lower end of the first hole and the upper end of the second hole are in contact with each other,
　wherein, when viewed from the direction in which the base surface extends, the conical frustum shape of the third hole becomes wider closer to the first surface relative to a portion at which the lower end of the third hole and the upper end of the fourth hole are in contact with each other,
　wherein, when viewed from the direction in which the base surface extends, the conical frustum shape of the fourth hole becomes wider closer to the second surface relative to the portion at which the lower end of the third hole and the upper end of the fourth hole are in contact with each other, and
　wherein when the first hole, the second hole, the third hole, and the fourth hole are viewed from the direction in which the base surface extends, an angle formed by a generatrix of the first hole and a generatrix of the second hole, which are in the thin region of the base member, is smaller than an angle formed by a generatrix of the third hole and a generatrix of the fourth hole, which are in the thick region of the base member.

2. The base member according to claim 1, wherein, when the base member is viewed from the direction in which the base surface extends, a thickness of the thin region the base member around a portion where the first via is arranged is thinner than a thickness of the thin region the base member at a portion where the via is not arranged.

3. A base member according to claim 1,
　wherein a width of the first hole in a direction vertical to the base surface and a width of the second hole in the direction vertical to the base surface are different from each other.

* * * * *